United States Patent [19]

Kabat

[11] 4,196,356
[45] Apr. 1, 1980

[54] EXPANDED TIME CONSTANT CONDITION CONTROL SYSTEM

[75] Inventor: John L. Kabat, Bloomington, Minn.

[73] Assignee: Honeywell Inc., Minneapolis, Minn.

[21] Appl. No.: 872,866

[22] Filed: Jan. 27, 1978

[51] Int. Cl.² .............................................. G05D 23/20
[52] U.S. Cl. .................................. 307/117; 236/46 F;
307/97; 219/492; 328/73
[58] Field of Search ..................... 307/117, 96, 97, 98,
307/99, 102, 293, 132 EA, 265, 220 R, 225 R;
219/492; 236/46 F, 1 C, 91 D; 328/73, 74, 129,
130, 41, 44; 318/596, 603

[56] References Cited

U.S. PATENT DOCUMENTS

| | | | |
|---|---|---|---|
| 3,523,182 | 8/1970 | Phillips | 307/117 |
| 3,579,122 | 5/1971 | Paine | 328/44 |
| 3,964,677 | 6/1976 | Schalow | 219/492 |
| 4,025,866 | 5/1977 | Fletcher | 307/225 R |

OTHER PUBLICATIONS

Time-Proportional Control, C. H. Loos, Control Engineering, May 1965, pp. 65-70.

Primary Examiner—Donald A. Griffin
Assistant Examiner—S. D. Schreyer
Attorney, Agent, or Firm—Alfred N. Feldman

[57] ABSTRACT

A condition responsive time proportional control means which has a relatively fast time constant when operating in its proportional band has the time constant expanded by means of a digital counter. The counter is repetitively switched by the condition responsive means and counts the switched operation. During the period that the switched operation is occurring, the time constant is expanded by simultaneously counting pulses from a pulse generating means.

21 Claims, 4 Drawing Figures

EXPANDED TIME CONSTANT CONDITION CONTROL SYSTEM

CROSS REFERENCE TO RELATED APPLICATIONS

On even date, an application Ser. No. 872,876 in the name of Arlon D. Kompelien is being filed covering a species of the invention generically claimed in the present application.

BACKGROUND OF THE INVENTION

Time proportional control systems that are condition responsive are known. One of the major applications of this type of condition responsive control system is in the control of heating and cooling equipment. The present invention is generally applicable to any type of condition control system that utilizes a condition responsive time proportional control, but will be generally described in terms of a thermostatically controlled system or thermostat.

A thermostat typically uses thermal anticipation to obtain a better system performance. This anticipation reduces the dependence on the ambient space temperature to actuate the thermostat between its "on" and "off" conditions. Various means are used to obtain the anticipation heat, but all of these are thermal and are, therefore, subject to the different air flows that exist in different installations. If the actual air flow over the thermostat in a particular application is greater or less than the air flow the thermostat was designed for, the actual temperature rise of the sensor due to the anticipator will be reduced or enhanced. This will result in less than optimum performance. A similar effect will occur if the air flow changes from time to time in a given installation. If the air flow is constant, the anticipator can be readjusted to bring back optimum performance, but in changing air flow conditions no one setting will be optimum. It should also be noted that in most thermostats, a change in the characteristics of the anticipator will also change the entire system droop.

In an electronic thermostat, anticipation can be achieved electronically. This has the advantage of not being affected by air flow and thus eliminates all of the problems associated with thermal anticipation as noted above. One method of obtaining this type of anticipation is the use of a resistor and capacitor charge and discharge arrangement as part of the negative feedback of an electronic amplifier while using a fixed positive feedback. This type of electronic anticipation is injected as a negative feedback mode with a single order time constant. For proper system operation, this time constant may need to be in the order of sixteen minutes. To obtain this type of a time constant with a single resistor-capacitor arrangement requires high resistances and a very low leakage, large capacitor. This requirement makes obtaining electronic anticipation impractical. The size of the resistors and capacitor would place a burden on the cost of the device, and on the physical size of the thermostat itself.

To obtain the desired time constant of approximately sixteen minutes, a relatively small capacitor and reasonable sized resistors can be used thereby obtaining the relatively fast cycling rate in the time proportional control circuit. This relatively fast cycling rate can then be directly counted. If a counter is allowed to count up at a given rate during the "on" time of the anticipation, and another counter is allowed to count up at the same rate during the "off" time, we would have a digital representation of the "on" and "off" time periods for the desired operating condition (that is the actual deviation from the set point of the room temperature). The sum of these two counters is the cycling period. This type of information gives a complete description of the cycling pattern of the system for a constant input of a given magnitude. If the average room temperature and the set point remain constant, we could then let the cycling pattern continue but no longer allow the counters to count up. Each time the "on-off" action of the comparator or electronics occurs, the time counter would be reduced by a one count. When the counter reaches zero counts, the system will turn "off". The "off-on" action of the comparator or electronic amplifier would then start to count down the "off" time counter. When the "off" time counter reaches zero, the system would turn "on" and the counters would be allowed to count up at the given rate. This multiplies the "on" and "off" period by the number of counts stored in the counters. Since the basic "on" and "off" periods are determined by a constant, the concept also effectively multiplies by that same constant. To keep the system closer to the actual operating conditions, the "off" period counter can be updated each time the "on" period counter is counted down. Similarily, the "on" period counter can be updated each time the "off" period counter is counted down.

As thus described, the system will work well as long as the comparator is cycling. However, if a set point change is made or the deviation from the set point is such that the cycling stops, there is a possibility that the control can go out of "phase". That is, the furnace can be "on" when it should be "off" or the opposite can ocurr. Therefore, some means must be provided that will sense when these conditions occur and force the output into the proper state. One way would be to use two level detectors which would force the output into the proper state when the deviation from the set point is greater than the maximum anticipation signal or when the deviation is effectively negative. This method would involve a very cricital calibration. A better way of accomplishing this timing function is disclosed in the present invention.

SUMMARY OF THE INVENTION

The present invention involves a condition responsive time proportional control means that has been specifically disclosed as a temperature responsive control means or thermostat. The time proportional circuit utilizes a relatively small capacitor and resistors, and has a rather rapid cycling rate. This rapid cycling rate is sensed by a timer circuit with a time period greater than approximately four times the time constant of the cycler. The timer is of a self-starting type and is reset each time the comparator changes state. If the comparator does not change state within the four time constant period, it can be assumed that the deviation from set point is greater than the anticipation signal. When the timer then times out, it forces the output into a mode which has been called for by the comparator or electronic amplifier of the circuit. In conjunction with the counter, the cycling of the time proportional circuit is amplified by the use of a counting means that responds to a pulse generating means where the pulse generating means has a frequency that is greater than the time constant of the system and is used for effectively multiplying the fast cycling rate of the small resistors and capacitor that are used in the amplifier or comparator. This allows for an expanded time constant control system that eliminates the need for a conventional thermal anticipator in a thermostat.

Also, the capacitor of the cycler or the cycling rate can be changed to tune the control system for any particular application without changing the system droop.

DESCRIPTION OF THE PREFERRED EMBODIMENT

Figure 1:
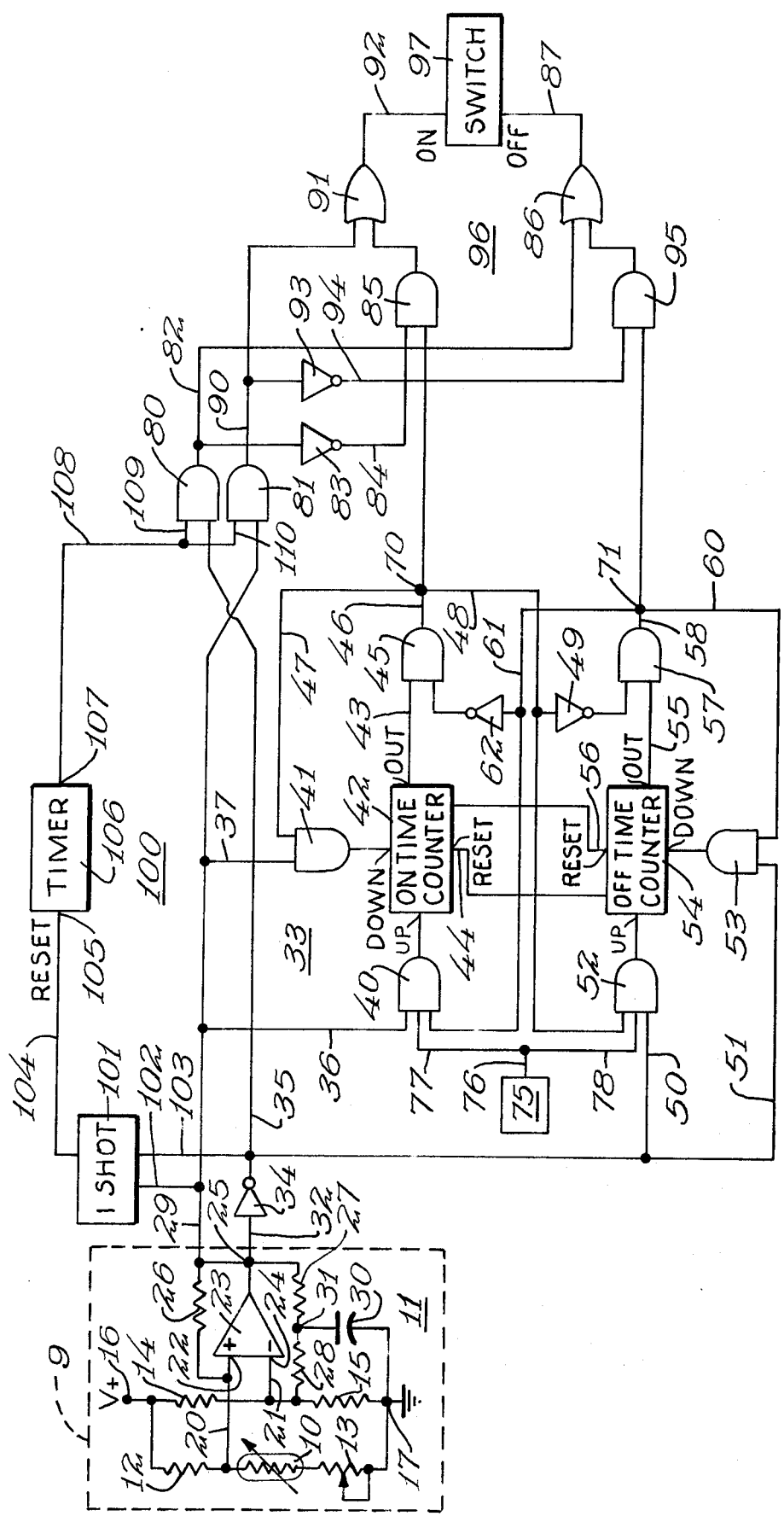
FIG. 1 is a schematic representation of an entire expanded time constant condition control system.

A complete expanded time constant condition control system is disclosed in FIG. 1. While the present condition control system can respond to any type of condition responsive means, the description will be generally directed to a thermostat or temperature responsive type of condition control system. A condition responsive time proportional control means is disclosed at 9. A condition responsive element 10, disclosed as a temperature responsive resistor, is provided in a bridge circuit 11 that includes a further resistor 12 and a set point potentiometer 13 as one leg of the bridge. The second leg of the bridge includes a voltage divider made up of resistors 14 and 15. The bridge means 11 is energized from a potential generally connected at 16 with a common or ground 17. If the presently disclosed device were a thermostat and the temperature responsive resistor 10 was used, it would normally be a negative temperature coefficient resistor for sensing and controlling the ambient temperature while the set point potentiometer 13 would establish the point of control for the system.

The output of the bridge means 11 is on a pair of conductors 20 and 21 with the conductor 20 connected to the non-inverting terminal 22 of an operational amplifier 23 while the inverting terminal 24 is connected to the conductor 21. The operational amplifier 23 has an output at the junction 25. Between the junction 25 and the conductor 20, a positive feedback resistor 26 is provided to create a positive differential for the system. Between the junction 25 and the conductor 21, a further pair of resistors 27 and 28 are provided along with a capacitor 30 that is connected at a common point 31 between the resistors 27 and 28. The network of resistors and capacitor between the junction 25 and the inverting terminal 24 of the operational amplifier 23 provides a time proportional negative feedback which is responsible, along with the resistors 14 and 15, for a time constant in the control systems operation. In the present disclosure the time constant created by the resistors 14, 15, 27, 28 and the capacitor 30 is a relatively short time constant, and is the time constant which is expanded by the balance of the system. The charge and discharge of the capacitor 30 is regulated by the associated resistors and the circuitry described to this point forms the condition responsive time proportional control means 9 which ultimately has a switched output. This general type of condition responsive time proportional control means is in and of itself known, but its normal operation is with a time constant that is too short for use in an effective temperature control system.

Figure 2:
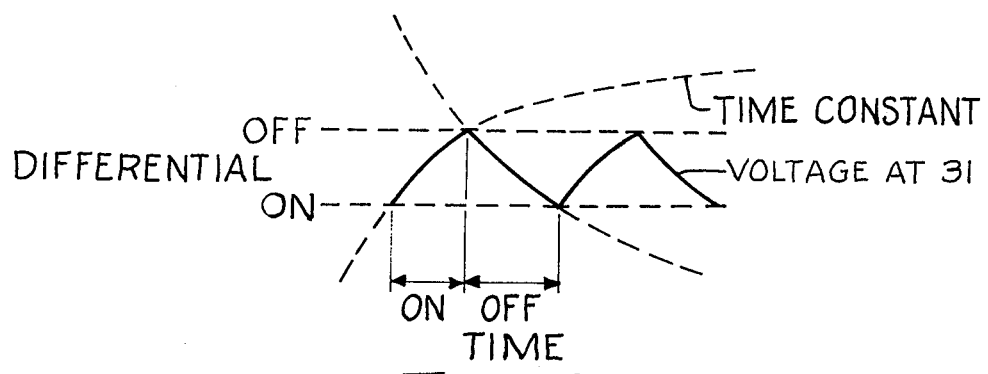
FIG. 2 is a representation of a wave form of the time constant which is to be expanded.
Figure 3:
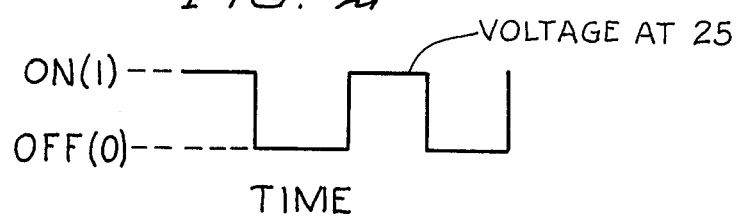
FIG. 3 is a graph of the repetitively switched output signals representative of the time constant.

The wave form of the charge and discharge of the capacitor 30 is disclosed in FIG. 2 as taken at the junction 31. The repetitively switched output signal is disclosed in FIG. 3 and is taken at the junction 25. In considering FIG. 2 it will be noted that the time constant established by the resistors and capacitor in the time proportional control means 9 establishes an "on" and "off" switching function for the operational amplifier 23 based on the resistance-capacitor characteristics of the feedback circuitry. As long as the control system is within a preselected range, this cycling action will take place. The "on" and "off" periods of time will vary depending on how close to a limit of the selected range the temperature actually is. The effect of this cycling will be described in more detail after a description of the entire system has been provided. In FIG. 3 the output of the operational amplifier 23 at the junction 25 is disclosed. It will be noted that the output voltage at the junction 25 is either "on" which represents a digital 1 or is "off" which provides a digital 0 for the balance of the system. In the disclosures of FIGS. 2 and 3 the "on" and "off" periods are approximately equal and the 1 and 0 times for the output voltage at junction 25 occurs for approximately the same length of time. As has been noted, this will vary depending on how close to a balance condition a bridge means 11 is.

The junction 25 is connected by a pair of conductors 29 and 32 to a counting means generally disclosed at 33. The conductor 32 is connected through a NOT gate 34 where the signal is inverted from the signal on conductor 29. The NOT gate 34 is connected by a conductor 35 to the actual counting means 33. It is thus apparent that the digital representation on conductors 29 and 35 are the opposites of each other at any given time. Conductor 29 is connected by conductors 36 and 37 to a pair of AND gates 40 and 41. The AND gates 40 and 41 are in turn connected to an on time counter disclosed at 42 and as has been indicated the AND gate 40 provides an up count while the AND gate 41 provides a down count for the on time counter 42. The on time counter 42 further has an output on conductor 43 and receives a reset signal on conductor 44.

The NOT gate 34 is connected by a pair of conductors 50 and 51 to a further pair of AND gates 52 and 53 which in turn are connected to an off time counter generally disclosed at 54. The AND gate 52 provides an up count for the off time counter 54 while the AND gate 53 provides a down count for the off time counter. The off time counter 54 has an output on a conductor 55 and receives a reset signal on a conductor 56. It will be noted that the reset conductor 56 is connected as an output of the counter 42, while the reset conductor 44 is connected to an output of the counter 54.

The on time counter 42 (at the output 43) is connected to a further AND gate 45 which has an output at 46 to a conductor 47 that is supplied back to the AND gate 41 and simultaneously provides an input to the AND gate 52 by conductor 48. Similarly, the off time counter 54 has the conductor 55 connected to an AND gate 57 which has an output on conductor 58 that is supplied to a conductor 60 that is connected back to the AND gate 53. At a junction 70 of the conductors 46 and 47 a first output signal for the counting means 33 is provided. A second output means for the counting means 33 is provided at 71 which is the junction of the conductors 58 and 60. To complete the counting means 33, a further conductor 48 is connected between the junction 70 and through a NOT gate 49 to the AND gate 57 while also forming an input to the AND gate 52. A further conductor 61 is connected to the junction 71 to provide an output to a NOT gate 62 back to the AND gate 45 while also forming a connection back to the AND gate 40.

The circuitry described to this point forms a counting means 33 utilizing conventional digital logic elements that have been shown in their typical schematic fashion. In order to have the counting means 33 perform in an understandable manner, it has assigned to it certain specific characteristics. These specific characteristics are that the on and off time counters 42 and 54 give a high output or a 1 whenever they contain a count. A high or 1 count on a reset line of either of the counters resets that counter to 0. The up and down inputs cannot be 1 at the same time and this is arranged for by the interconnection of the AND and NOT gates. Also, the last count down going into either of the counters 42 or 54 does not generate a reset pulse and, therefore, leaves the last count up in the other of the counters. The on or the off counters 42 and 54 always end up with a count in one of them equal to at least 1. This is a design selection based on the makeup of the digital components. If the system were designed otherwise, the system would lockup and would not operate. The specific type of counting means 33, as long as it meets the above criteria, can be designed in a number of ways. A simple arrangement of digital elements have been shown to provide the defined counting function.

The counting means 33 is fed additionally from an oscillator or pulse generating means 75 that can be a free-running oscillator or can be a frequency synchronized type of oscillator that generates a continuous stream of pulses on conductor 76 which is in turn provided by conductors 77 and 78 to the AND gates 40 and 42 to provide a multiplying function to expand the time constant of the condition control system, as will be described in detail in connection with the operation of the system.

The conductors 29 and 35 from the time proportional or temperature control means 9 further extend to a pair of AND gates 80 and 81 which combined with other digital logic from the output junction 70 and 71. The AND gate 80 connects to a conductor 82 as well as a NOT gate 83 where the signal is inverted on the conductor 84. The conductor 84 is connected to a further AND gate 85 that also is connected to the junction 70 of the counting means 33. The previously mentioned conductor 82 is connected to an OR gate 86 which provides an output on conductor 87 indicating that the system is "off".

The AND gate 81 is connected to a conductor 90 that is connected to an OR gate 91 which has an output conductor 92 which provides an "on" signal for the system. The conductor 90 also passes through a NOT gate 93 where it is connected by a conductor 94 to a further AND gate 95 that in turn is driven by the output 71 of the counting means 33. The AND gates 80, 81, 85 and 95, along with the NOT gates 83 and 93, and the OR gates 91 and 86 form a digital logic means generally disclosed as 96. The digital logic means 96 interconnects the counting means 33 to a switch generally disclosed at 97. The switch 97 is any type of switch means but will be shown as one which can be driven to an "on" or "off" state and will remain in that state once driven to that state. The switch means 97 can be entirely solid state, or it could be a relay arrangement of a type that will be described in some detail in connection with FIG. 4.

The system disclosed in FIG. 1 is completed by the addition of a timer means generally disclosed at 100. The timer means 100 includes a one-shot pulse device which is connected by conductor 102 to conductor 29 and by conductor 103 to the conductor 35. It is thus apparent that the one-shot device 101 receives a triggering pulse each time the output junction 25 receives either a 0 or a 1 as an output from the operational amplifier 23.

The one-shot device 101, through a conductor 104, acts on a reset terminal 105 of the timer element 106. The timer element 106 is any type of a time generating timer that starts a timing function upon receiving a reset signal on conductor 104 from the one-shot element 101. The timing element 106 has a time function which is greater than approximately four times the time constant of the time proportional control means which includes the capacitor 30. Each time the one-shot device operates the reset terminal 105 receives a signal, and the timer is reset to zero time. If the timer element 106 does not receive a pulse for a time interval exceeding approximately four times the time constant of the time proportional control means 9, an output conductor 107 receives a voltage representing a 1 and this 1 remains on the output 107 until the reset 105 receives a further pulse. The output 107 is connected by conductor 108 to a pair of conductors 109 and 110 to the AND gates 80 and 81 to provide a reset function in the digital logic means 96.

Figure 4:
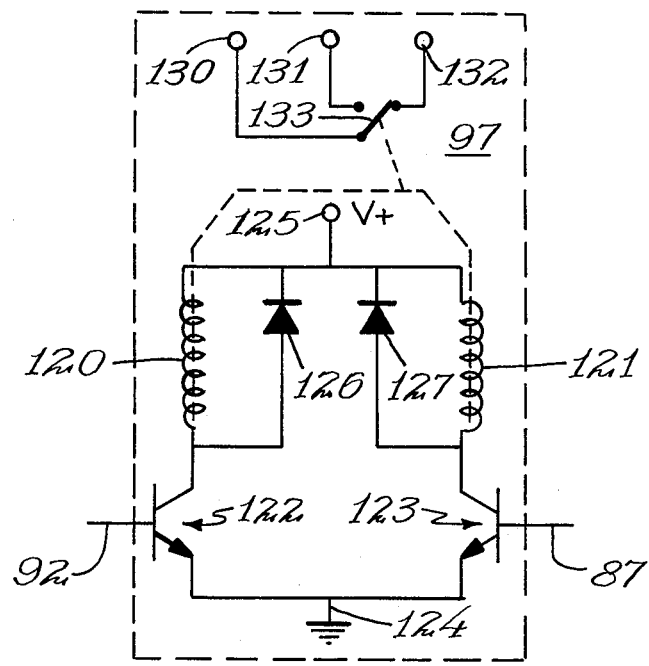
FIG. 4 is a schematic diagram of a load switch usable as an output for the control system.

Before the operation of the system is described, the output switch 97 will be discussed in connection with FIG. 4. As has been indicated, any type of switch could be used but the output switch means 97 has been specifically disclosed as including a pair of relay coils 120 and 121 which are interconnected to a pair of transistors generally disclosed at 122 and 123. The emitters of each of the transistors are grounded at 124 while the relay coils 120 and 121 are energized from a potential source at a terminal 125. A pair of free-wheeling diodes 126 and 127 are provided. The transistor 122 is connected to the conductor 92 to receive an "on" signal, and to the conductor 87 to receive an "off" signal. The switch means 97 has three output terminals 130, 131, and 132 with the terminal 130 being connected in common to a switching element 133 that switches back and forth between the terminals 131 and 132. The switch means 97 that is disclosed in FIG. 4 is a bistable magnetic type relay that is commercially available and has been disclosed for convenience in completing the description of the present device. The output switch means 97 could be a solid state switch or any other type of bistable switch means.

OPERATION

The operation of the expanded time constant system of FIG. 1 is best understood when a set of assumptions as to an operating state are first provided. It is assumed that the condition responsive time proportional control means 9, which has been represented as a temperature responsive system responding to the temperature of the sensing resistor 10, is near the temperature called for by the set point potentiometer 13. At this point of operation, the operational amplifier 23 is caused to repetitively switch providing an output signal at the junction 25. If it is assumed that the switching rate is approximately 50 percent "on" and 50 percent "off", the voltage versus time graphs of FIGS. 2 and 3 would be appearing at the junctions 25 and 31. The temperature control system is assumed to be in an "on" state calling for heat which would require the output switch means 97 to be in an "on" condition. With the output switch means 97 in an "on" condition, the junction 70 has a digital 1 while the junction 71 has a digital 0. The on time counter means 42 has a finite number of counts stored in it, and the off time counter means 54 is being reset each time the on time counter means 42 counts down (the exception of the final count down). Also, since the output at the junction 25 is a repetitively switch signal, the one-shot device 101 is repetitively resetting the timer means 106 so that the output to the AND gates 80 and 81 includes a 0 on conductors 109 and 110 thereby keeping the AND gates 80 and 81 in a state where the conductors 82 and 90 each have a 0. With a 0 on conductor 82, the inverter or NOT gate 83 inverts the signal and on conductor 84 a 1 is provided. The 1 from the junction 70 along with the 1 from conductor 84 passes through the AND gate 85 and the OR gate 91 to provide conductor 92 with an "on" signal. At this same time, the AND gate 95 is receiving a 0 from junction 71 and has a 0 output. Since there is 0 output from the AND gate 95 and there is 0 output on conductor 82, the OR gate 86 has a 0 on conductor 87 thereby having no affect on the output switch means 97.

With the conditions above described, each time the operational amplifier 23 repetitively cycles, the conductors 31 and 35 have a repetitive 1, 0 and a 0, 1 digital signal provided. The one-shot means 101 keeps resetting the timer means 106 so that neither of the AND gates 80 nor 81 can change the "on" condition of the switch means 97. The 1 signal on conductor 29 is fed to conductor 37 where it is combined with a 1 from the junction 70 so that the AND gate 41 cause the on time counter means 42 to count down one digit. At this same time the reset line 56 is activated and the off time counter means 54 is reset to zero.

As soon as the repetitive signal reverses so that the 1 is on conductor 35 while the 0 is on conductor 29, the AND gate 52 receives a 1 on conductor 50 and a series of 1 pulses from the oscillator 75 on conductor 78. Since the output of the on time counter means 42 is "on", the junction 70 has a 1 so that the AND gate 52 is receiving 1's on all of its inputs. This allows the off time counter means 54 to count up an expanded number of counts representative by the frequency of the oscillator means 75.

When the system reverses itself again, the on time counter means 42 counts down 1 and resets the off time counter means 54. When the down count in the on time counter means 42 reaches its final stored count, the reset line 56 is not activated and the off time counter means 54 retains a finite number of counts based on the expanded time constant required for the system. After the on time counter means 42 has counted down its final count, the output on conductor 43 goes to a 0 and the AND gate 45 no longer provides a 1 on conductor 46 to the junction 70. The junction 70 then goes to a 0 which is inverted by the NOT gate 49 and is provided as a 1 input to the AND gate 57. At this time the conductor 55 of the output of the off time counter means 54 also has a 1, and the junction 71 becomes a 1 while the junction 70 has become a 0. In following these signals, the 1 on the junction 71 is fed to the AND gate 95 along with the inverted 0 that was on the conductor 90. The NOT gate 93 inverts the 0 on conductor 90 and provides a 1 to the AND gate 95 which then in turn causes the OR gate 86 to provide a 1 on the conductor 87 to cause the switch means 97 to switch to an "off" condition. Since the AND gate 85 no longer has an output the OR gate 91 no longer has an output and the "on" input to the switch means 97 is inactive.

The above is the normal cyclic operation of the system. This system has the capability by the addition of the one-shot means 101, the timer means 106, and the digital logic means that interfaces with the timer means 106 to insure that any disruptive type of function is overcome by the system and the system is righted. If it is assumed that power is temporarily lost and that the system is reenergized, the state of the switch means 97 must be brought into conformance with the commands of the condition responsive time proportional control means 9 within a reasonable period of time. This reasonable period of time has been selected as approximately four times the time constant of the condition responsive time proportional control means 11.

If for instance, power has been off for a substantial period of time and a home has been cooling because of a lack of the operation of the switch means 97 and its associated equipment, the restoration of power must bring the system to an "on" state when power is restored. If the restoration of power happens to clear the logic or establish a logic in the system which would provide a 1 on conductor 87, the switch means 97 would improperly be "off". This would occur when the condition responsive time proportional control means 9 is far from its proper set point and the output would be a constant on conductors 29 and 35 rather than the repetitive switched output signals that are normally there when the condition responsive time proportional control means 9 is within its normal operating range. With the signals on conductors 31 and 35 fixed, the one-shot means 101 does not reset the timer means 106 and after four times the time constant of the system a 1 is provided on conductor 107. the 1 on conductor 107 is fed to the AND gates 80 and 81. It should be noted that if the total system has come up in an "off" state when it should be in an "on" state, the conductor 29 will have a 0 when it should have had a 1. The 0 on conductor 29 is fed to the AND gate 81 along with the 1 on conductor 110. This provides an output 1 on the conductor 90 which is fed to the OR gate 91 and ultimately to the conductor 92 to provide a "on" signal to the switch means 97 which restores the heating operation of the system.

As long as the system is unbalanced to the point where a repetitive signal is not provided, the timer means 106 provides an output to make sure that the system is properly sequenced. The reverse of the above outlined arrangement of failures can be run through and it will be found that if the total system has accidently come "on" when it should have been "off" that the timer means 106 will, along with the digital logic means, bring the switch means 97 to an "off" state. The system will continue to operate in a proper cyclic mode when the temperature or condition responsive control means reaches the necessary selected range of operation.

The present invention primarily is directed to the concept of an expanded time constant control which utilizes a condition responsive time proportional control means that is combined with a counting means to expand the time constant. The expanded time constant can be accomplished with relatively small and inexpensive digital logic elements. If the control were accomplished merely by changing the size of the resistors and the capacitor in the time constant circuit, the condition responsive time proportional control means 9 would become too large and costly to be of practical value. The present invention has been disclosed as utilizing one particular type of counting means and a single type of pulse generating means along with specific logic. As is the case in most digital circuitry, there are many possible implementations of accomplishing a digital function once the basic logic has been established. The present application discloses a preferred embodiment that utilizes an up-down counting means and either a switch that utilizes magnetic coils or a conventional switch. All of these areas can be readily changed within the knowledge of one skilled in the art and as a result thereof, the applicant wishes to be limited in the scope of his invention solely by the scope of the appended claims.

The embodiments of the invention in which an exclusive property or right is claimed are defined as follows:

1. An expanded time constant condition control system, including: condition responsive time proportional control means having switched output means; said switched output means providing repetitively switched output signals at a rate representative of a time constant of said time proportional control means when said condition responsive means senses a condition which is within a selected range; said switched output means providing constant output signals when said condition is outside of said selected range; counting means having input means responsive to said switched output signals; said counting means including pulse generating means; said pulse generating means having output means connected to said counting means and providing signals thereto; and said counting means combining said condition responsive repetitively switched output signals and said pulse generating output signals to expand said time constant of said condition responsive time proportional control means at an output means of said counting means.

2. An expanded time constant condition control system as described in claim 1 wherein said condition responsive means is temperature responsive means.

3. An expanded time constant condition control system as described in claim 2 wherein said temperature responsive means includes a temperature responsive resistor as part of a bridge circuit.

4. An expanded time constant condition control system as described in claim 3 wherein said time constant of said temperature responsive means is provided by the chargeing and discharging of a capacitor.

5. An expanded time constant condition control system as described in claim 4 wherein said temperature responsive bridge circuit and said capacitor are connected to amplifier means; and said amplifier means having output circuit means to in turn provide said repetitively switched output signals between a high and a low state.

6. An expanded time constant condition control system as described in claim 5 wherein said counter means is digital up-down counter means responsive to said repetitively switched output signals and said pulse generating means to time proportionally count said high and said low states to thereby provide said expanded time constant which is representative of said temperature responsive time constant.

7. An expanded time constant condition control system as described in claim 6 wherein said up-down counter means has two output circuits; said counter means further including gating circuit means interconnected therein to always provide one of said counter means output circuits with a count when the other of said counter means output circuits is without a count.

8. An expanded time constant condition control system as described in claim 7 wherein said pulse generating means is a free-running oscillator.

9. An expanded time constant condition control system as described in claim 1 wherein said condition responsive control means switch output means is connected to timer means with said timer means repetitively starting a timing function upon said switched output means providing said repetitively switched output signals; logic means connected to output means of said timer means and said output means of said counting means; and control system output switch means connected to said logic means and responsive to said condition responsive control means; said timer means output and said counting means output further causing said logic means to periodically assure that said output switch means is kept responsive to said condition responsive time proportional control means when said condition responsive means output is constant.

10. An expanded time constant condition control system as described in claim 9 wherein said condition responsive means is temperature responsive means.

11. An expanded time constant condition control system as described in claim 10 wherein said temperature responsive means includes a temperature responsive resistor as part of a bridge circuit.

12. An expanded time constant condition control system as described in claim 11 wherein said time constant of said temperature responsive means is provided by the charging and discharging of a capacitor.

13. An expanded time constant condition control system as described in claim 12 wherein said temperature responsive bridge circuit and said capacitor are connected to amplifier means; and said amplifier means having output circuit means to in turn provide said repetitively switched output signals between a high and a low state.

14. An expanded time constant condition control system as described in claim 13 wherein said counter means is digital up-down counter means responsive to said repetitively switched output signals and said pulse generating means to time proportionally count said high and said low states to thereby provide said expanded time constant which is representative of said temperature responsive time constant.

15. An expanded time constant condition control system as described in claim 14 wherein said up-down counter means has two output circuits; said counter means further including gating circuit means interconnected therein to always provide one of said counter means output circuits with a count when the other of said counter means output circuits is without a count.

16. An expanded time constant condition control system as described in claim 15 wherein said pulse generating means is a free-running oscillator.

17. An expanded time constant condition control system as described in claim 1 wherein said control system further includes logic means connected to said counting output means; and output switch means connected to said logic means; said counting means and said logic means periodically supplying said switch means with a signal to assure that said output switch means is kept responsive to said condition responsive time proportional time control means.

18. An expanded time constant condition control system as described in claim 17 wherein said output switch means is a bistable switch.

19. An expanded time constant condition control system as described in claim 18 wherein said condition responsive means is temperature responsive means.

20. An expanded time constant condition control system as described in claim 19 wherein said temperature responsive means includes a temperature responsive resistor as part of a bridge circuit.

21. An expanded time constant condition control system, including: condition responsive time proportional control means having switched output means; said switched output means providing repetitively switched digital output signals at a rate representative of a time constant of said time proportional control means when said condition responsive means senses a condition which is within a selected range; said switched output means providing constant output signals when said condition is outside of said selected range; digital counting means having input means responsive to said switched output signals; said digital counting means including digital pulse generating means; said digital pulse generating means having output means connected to said counting means and providing signals thereto; and said counting means combining said condition responsive repetitively switched output signals and said pulse generating output signals to expand said time constant of said condition responsive time proportional control means at an output means of said counting means.

* * * * *